US008965458B2

(12) United States Patent
Richardson et al.

(10) Patent No.: US 8,965,458 B2
(45) Date of Patent: Feb. 24, 2015

(54) PROTECTIVE CUSHION COVER FOR AN ELECTRONIC DEVICE

(75) Inventors: Curtis R. Richardson, Fort Collins, CO (US); Alan V. Morine, Fort Collins, CO (US); W. Travis Smith, Fort Collins, CO (US); John H. Loudenslager, Phoenix, AZ (US); Jamie L. Johnson, Fort Collins, CO (US); Matthew M. Glanzer, Loveland, CO (US)

(73) Assignee: Otter Products, LLC, Fort Collins, CO (US)

( * ) Notice: Subject to any disclaimer, the term of this patent is extended or adjusted under 35 U.S.C. 154(b) by 909 days.

(21) Appl. No.: 12/687,390

(22) Filed: Jan. 14, 2010

(65) Prior Publication Data

US 2010/0147737 A1 Jun. 17, 2010

Related U.S. Application Data

(60) Provisional application No. 61/236,065, filed on Aug. 21, 2009.

(51) Int. Cl.
*H04B 1/38* (2006.01)
*A45C 11/00* (2006.01)
(Continued)

(52) U.S. Cl.
CPC ........... *A45C 11/00* (2013.01); *A45C 2011/002* (2013.01)
USPC .................. 455/566; 379/433.11; 379/433.12; 379/433.13; 206/701; 206/320

(58) Field of Classification Search
CPC .................................................... H04B 1/3888
USPC .............. 455/566; 206/701, 320; 379/433.11, 379/433.12, 433.13; 361/681, 679
See application file for complete search history.

(56) References Cited

U.S. PATENT DOCUMENTS 3,665,991 A 5/1972 Gillemot et al.
4,097,878 A 6/1978 Cramer
(Continued)

FOREIGN PATENT DOCUMENTS

JP 08018637 1/1996
JP 2003164316 A 6/2003
(Continued)

OTHER PUBLICATIONS

"Dual Protection for your iPhone", Aug. 4, 2008: http://blog.myincipio.com/news/dual-protection-for-your-iphone-2-part-silicrylic-silicone-crystal-case-for-apple-iphone-3g.html.
(Continued)

*Primary Examiner* — Christopher M Brandt
*Assistant Examiner* — Muthuswamy Manoharan

(57) ABSTRACT

Disclosed is a protective case for an electronic device. The protective case has two layers, an inner cushion cover that surrounds a portion of the electronic device and an outer rigid shell. The outer rigid shell has curved flexible arms that engage and hold the cushion cover 104 on the electronic device. The cushion cover has reduced thickness portions so that the curved flexible arms are embedded in the cushion cover and provide a protective case having a substantially smooth exterior. The cushion cover is capable of absorbing shocks from impacts on the rigid outer shell. Coring on the inner portion of the cushion cover provides additional softness and the ability of the cushion cover to absorb shocks while using a higher density material, which is able to conform to the electronic device.

9 Claims, 20 Drawing Sheets

(51) Int. Cl.
*H04M 1/00* (2006.01)
*B65D 85/00* (2006.01)

(56) References Cited

U.S. PATENT DOCUMENTS

| | | |
|---|---|---|
| 4,352,968 A | 10/1982 | Pounds |
| 4,375,323 A | 3/1983 | Inagaki et al. |
| 4,703,161 A | 10/1987 | McLean |
| 4,733,776 A | 3/1988 | Ward |
| 4,762,227 A | 8/1988 | Patterson |
| 4,836,256 A | 6/1989 | Meliconi |
| 5,002,184 A | 3/1991 | Lloyd |
| 5,025,921 A | 6/1991 | Gasparaitis et al. |
| 5,123,044 A | 6/1992 | Tate |
| 5,175,873 A | 12/1992 | Goldenberg et al. |
| 5,360,108 A | 11/1994 | Alagia |
| 5,368,159 A | 11/1994 | Doria |
| 5,380,968 A | 1/1995 | Morse |
| 5,386,084 A | 1/1995 | Risko |
| 5,388,691 A | 2/1995 | White |
| 5,388,692 A | 2/1995 | Withrow et al. |
| 5,505,328 A | 4/1996 | Stribiak |
| 5,583,742 A | 12/1996 | Noda et al. |
| 5,648,757 A | 7/1997 | Vernace et al. |
| 6,031,524 A | 2/2000 | Kunert |
| 6,041,924 A | 3/2000 | Tajima |
| 6,068,119 A | 5/2000 | Derr et al. |
| 6,073,770 A | 6/2000 | Park |
| 6,094,785 A | 8/2000 | Montgomery et al. |
| 6,201,867 B1 | 3/2001 | Koike |
| 6,304,459 B1 | 10/2001 | Toyosato et al. |
| 6,305,656 B1 * | 10/2001 | Wemyss ............ 248/309.4 |
| 6,317,313 B1 | 11/2001 | Mosgrove et al. |
| 6,375,009 B1 | 4/2002 | Lee |
| 6,445,577 B1 | 9/2002 | Madsen et al. |
| 6,456,487 B1 | 9/2002 | Hetterick |
| 6,471,056 B1 | 10/2002 | Tzeng |
| 6,536,589 B2 | 3/2003 | Chang |
| 6,616,111 B1 | 9/2003 | White |
| 6,701,159 B1 | 3/2004 | Powell |
| 6,731,913 B2 | 5/2004 | Humphreys et al. |
| 6,781,825 B2 | 8/2004 | Shih et al. |
| 6,962,454 B1 | 11/2005 | Costello |
| 6,971,517 B2 | 12/2005 | Chen |
| 6,980,777 B2 | 12/2005 | Shepherd et al. |
| 7,046,230 B2 | 5/2006 | Zadesky et al. |
| 7,050,841 B1 | 5/2006 | Onda |
| 7,069,063 B2 | 6/2006 | Halkosaari et al. |
| 7,085,542 B2 | 8/2006 | Dietrich et al. |
| 7,146,701 B2 | 12/2006 | Mahoney et al. |
| 7,194,202 B2 | 3/2007 | Funahashi et al. |
| 7,194,291 B2 | 3/2007 | Peng |
| 7,225,923 B2 | 6/2007 | Hallee |
| 7,230,823 B2 | 6/2007 | Richardson et al. |
| 7,236,588 B2 | 6/2007 | Gartrell |
| 7,255,228 B2 | 8/2007 | Kim |
| D557,261 S | 12/2007 | Rickard |
| 7,312,984 B2 | 12/2007 | Richardson et al. |
| 7,343,184 B2 | 3/2008 | Rostami |
| D565,291 S | 4/2008 | Brandenburg |
| 7,400,917 B2 | 7/2008 | Wood et al. |
| D574,819 S | 8/2008 | Andre et al. |
| D575,056 S | 8/2008 | Tan |
| 7,418,278 B2 | 8/2008 | Eriksson et al. |
| 7,428,427 B2 | 9/2008 | Brunstrom et al. |
| 7,449,650 B2 | 11/2008 | Richardson et al. |
| D582,149 S | 12/2008 | Tan |
| 7,495,895 B2 * | 2/2009 | Carnevali ............ 361/679.26 |
| 7,540,844 B2 | 6/2009 | Muser |
| 7,555,325 B2 | 6/2009 | Goros |
| D597,089 S | 7/2009 | Khan et al. |
| 7,594,576 B2 | 9/2009 | Chen et al. |
| 7,609,512 B2 | 10/2009 | Richardson et al. |
| D603,603 S | 11/2009 | Laine |
| 7,623,898 B2 | 11/2009 | Holmberg |
| D606,751 S | 12/2009 | Andre et al. |
| 7,630,746 B2 | 12/2009 | Holmberg |
| 7,663,878 B2 | 2/2010 | Swan et al. |
| 7,663,879 B2 | 2/2010 | Richardson et al. |
| D610,807 S | 3/2010 | Bau |
| D616,430 S | 5/2010 | Fathollahi |
| D619,361 S | 7/2010 | Andre et al. |
| D620,000 S | 7/2010 | Bau |
| D622,716 S | 8/2010 | Andre et al. |
| D623,180 S | 9/2010 | Diebel |
| D624,532 S | 9/2010 | Huskinson |
| D624,908 S | 10/2010 | Huskinson |
| D624,909 S | 10/2010 | Huskinson |
| 7,933,122 B2 | 4/2011 | Richardson et al. |
| D644,215 S | 8/2011 | Dong |
| 8,204,561 B2 | 6/2012 | Mongan et al. |
| 2002/0065054 A1 | 5/2002 | Humphreys et al. |
| 2002/0079244 A1 | 6/2002 | Kwong |
| 2002/0085342 A1 | 7/2002 | Chen et al. |
| 2002/0086702 A1 | 7/2002 | Lai et al. |
| 2003/0103624 A1 | 6/2003 | Hu |
| 2003/0151890 A1 | 8/2003 | Huang et al. |
| 2004/0014506 A1 | 1/2004 | Kemppinen |
| 2005/0247584 A1 | 11/2005 | Lu |
| 2005/0279661 A1 | 12/2005 | Hodges |
| 2006/0255493 A1 | 11/2006 | Fouladpour |
| 2007/0071423 A1 | 3/2007 | Fantone et al. |
| 2007/0115387 A1 | 5/2007 | Ho |
| 2007/0158220 A1 | 7/2007 | Cleereman et al. |
| 2008/0039161 A1 | 2/2008 | Chan |
| 2008/0163463 A1 | 7/2008 | Hulden |
| 2008/0316687 A1 | 12/2008 | Richardson |
| 2009/0009945 A1 | 1/2009 | Johnson et al. |
| 2009/0034169 A1 | 2/2009 | Richardson et al. |
| 2009/0111543 A1 | 4/2009 | Tai et al. |
| 2009/0113758 A1 | 5/2009 | Nishiwaki |
| 2009/0283184 A1 | 11/2009 | Han |
| 2010/0096284 A1 * | 4/2010 | Bau ............ 206/320 |
| 2010/0104814 A1 | 4/2010 | Richardson |
| 2010/0203931 A1 | 8/2010 | Hynecek et al. |

FOREIGN PATENT DOCUMENTS

| | | |
|---|---|---|
| WO | 9400037 A1 | 1/1994 |
| WO | 9941958 A1 | 8/1999 |
| WO | 2007122722 | 1/2007 |

OTHER PUBLICATIONS

"Incipio Makes a Splash", Feb. 9, 2009: http://blog.myincipio.com/news/incipio-makes-a-splash-with-silicrylic-for-blackberry-storm-9530.html.

* cited by examiner

PROTECTIVE CUSHION COVER FOR AN ELECTRONIC DEVICE

CROSS-REFERENCE TO RELATED APPLICATION

This application claims benefit of and priority to U.S. Provisional Patent Application Ser. No. 61/236,065, entitled "Protective Cushion Cover for an Electronic Device" by Curtis R. Richardson, et al., filed Aug. 21, 2009, the entire contents of which are specifically incorporated herein by reference for all that they disclose and teach.

BACKGROUND OF THE INVENTION

Numerous different types of electronic devices currently exist for communication, entertainment and other purposes. These include cell phones, MP3 players, video players, smartphones, communication devices, such as walkie-talkies, navigation devices, such as GPS devices, and other types of electronic devices, such as various types of computers, including laptop computers, hand-held computers, ultra-mobile computers and tablet computers. These devices often include touch screens, interactive panels including, but not limited to, capacitive coupled interfaces, keyboards, scroll wheels, tilt switches, push button switches, and other interactive controls. Due to the sensitive nature of these electronic devices, it is desirable to provide protection for these devices.

SUMMARY OF THE INVENTION

An embodiment of the present invention may therefore comprise a protective case for an electronic device comprising: a rigid outer shell having a back portion that is connected to a plurality of curved flexible arms that engage the electronic device, on at least two surfaces, the rigid outer shell made from a plastic material that is capable of bending sufficiently to engage the electronic device without breaking and having sufficient elasticity to cause the plurality of curved flexible arms to generate a force on the at least two surfaces; a cushion cover made from a single elastomeric material that is form-fitted to cover a portion of the electronic device, the cushion cover having a density and elasticity that causes the cushion cover to conform to the electronic device, the cushion cover comprising: reduced thickness portions disposed in predetermined areas of the cushion cover, the plurality of curved flexible arms disposed in, and engaged with, the reduced thickness portions such that the force generated by the plurality of curved flexible arms is coupled through the reduced thickness portions to the electronic device; raised impact portions located adjacent to the reduced thickness portions, the raised impact portions having a predetermined thickness.

An embodiment of the present invention may further comprise a method of protecting an electronic device from impacts comprising: providing a rigid outer shell having a back portion that is connected to a plurality of curved flexible arms that engage the electronic device on at least two surfaces, the rigid outer shell made from a plastic material that is capable of bending sufficiently to engage the electronic device without breaking and having sufficient elasticity to cause the plurality of flexible arms to generate a force on the at least two surfaces; providing a cushion cover made from a single elastomeric material that is form-fitted to cover a portion of the electronic device, the cushion cover having a density and elasticity that causes the cushion cover to conform to the electronic device, the cushion cover comprising: reduced thickness portions disposed on predetermined areas of the cushion cover, the plurality of curved flexible arms disposed in and engaged with, the reduced thickness portions such that the force generated by the plurality of curved flexible arms is coupled through the reduced thickness portions to the electronic device; raised impact portions located adjacent to the reduced thickness portions, the raised impact portions having a predetermined thickness.

DETAILED DESCRIPTION OF THE EMBODIMENTS

Figure 1:
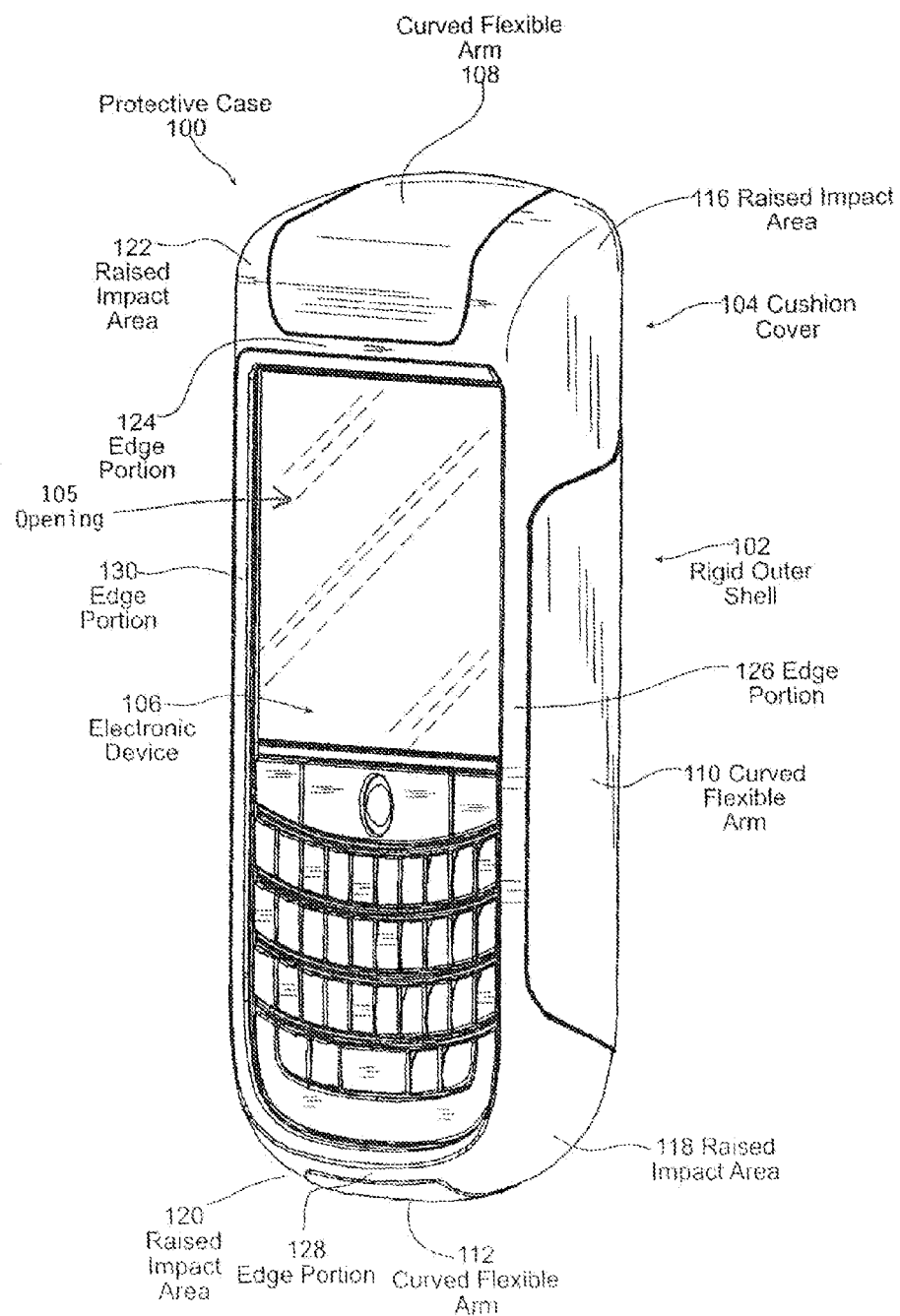
FIG. 1 is a schematic perspective view of an embodiment of a protective covering system for an electronic device.

FIG. 1 is a schematic perspective view of one embodiment of a protective case 100 that utilizes a protective cushion cover 104 that is surrounded by a rigid outer shell 102 to provide protection to an electronic device 106. The electronic device 106 can be any type of an electronic device including various types of MP3 players, video players, cell phones, smartphones, satellite phones, walkie-talkies, GPS navigational devices, telematics devices, pagers, monitors, personal data assistants, bar code scanners, as well as various types of computers including portable computers, laptop computers, handheld computers, ultra-mobile computers, tablet computers and various hybrid devices that combine two or more of these functions. In addition, these devices may operate with only a touch screen interface or only a keyboard and display or other type of manual input, and are not limited to devices that include keyboards or buttons as well as a touch screen.

Figure 2:
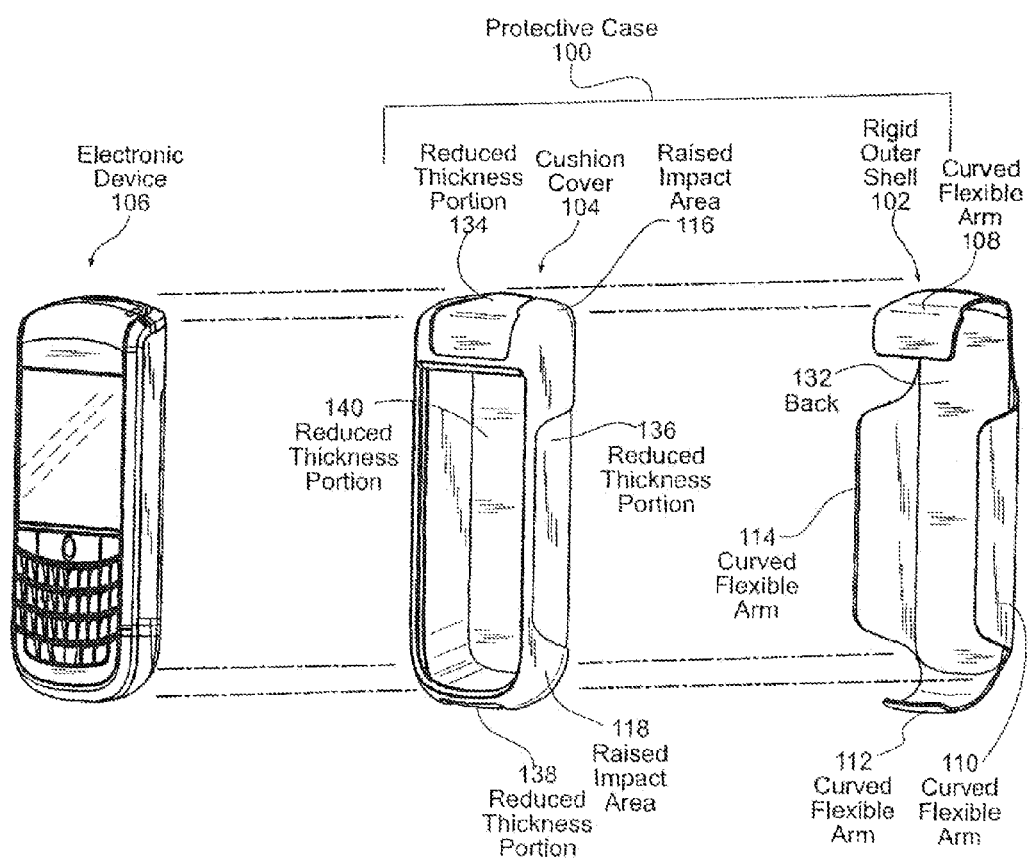
FIG. 2 is an exploded schematic perspective view of the embodiment illustrated in FIG. 1.

As shown in FIG. 1, the rigid outer shell 102 has a plurality of curved flexible arms 108, 110, 112, 114 (FIG. 2). The rigid outer shell is an injected molded shell that is constructed from polycarbonate, nylon, polycarbonate and nylon blend, a polycarbonate methyl methacrylate butadiene styrene or other similar material that can bend without breaking. The rigid outer shell 102 is formed so that the curved flexible arms 108-114 have sculpted edges without sharp corners that intersect with and hold the cushion cover 104 on the electronic device 106. The rigid outer shell 102 is sufficiently thin to allow the curved flexible arms 108-114 which allows the electronic device 106 that is covered with the cushion cover 104, to be inserted into the rigid outer shell 102. In that regard, the curved flexible arms 108-114 have sufficient elasticity to allow sufficient flexion of the curved flexible arms 108-114 to insert the electronic device 106 and cushion cover 104 into the rigid outer shell 102 without breaking the curved flexible arms 108-114, which holds the cushion cover 104 securely on the outer surface of the electronic device 106. Hence, the curved flexible arms 108-114 secure and hold the cushion cover 104 on the outer surface of the electronic device 106.

Pre-shaping of the cushion cover 104, illustrated in FIG. 1, makes the cushion cover form-fitting around the electronic device 106. The cushion cover 104 is made from a soft, pliable material, such as an elastomeric material, that is capable of stretching sufficiently to allow the electronic device 106 to slide easily into and be removed from the cushion cover 104. The cushion cover 104 has sufficient elasticity to allow the protective cover to conform closely to the electronic device 106 after the cushion cover 104 has been stretched over the electronic device 106. The cushion cover 104 can be made of a variety of thermoset materials, such as synthetic rubber, silicon, urethane and other materials that are capable of stretching sufficiently to allow the electronic device 104 to slide into the front opening 105 of the cushion cover 104 while maintaining the form-fitting shape of the cushion cover 104. The density and elasticity of the cushion cover 104, as well as the pre-forming of the cushion cover 104 to fit the shape of electronic device 106, allows the material of the cushion cover 104 to both stretch and recover so that the cushion cover fits tightly on the electronic device 106.

The raised portions of the cushion cover 104 that are illustrated in FIG. 1, including the raised impact areas 116-122, as well as the edge portions 124, 126, 128, 130, prevent an impact with a hard surface from being transmitted directly to the electronic device 106. The material of the cushion cover 104 is sufficiently soft and sufficiently thick to substantially absorb and prevent an impact with a hard surface from fully compressing the cushion cover 104. In that regard, the raised impact areas 116-122 are located on surfaces where an impact with a hard surface is likely to occur that could cause damage to the electronic device 106, such as the corners and the area surrounding the front portion of the electronic device 106.

FIG. 2 is an exploded view of the embodiment of FIG. 1. As shown in FIG. 2, a slim profile for the protective case 100 is desirable to allow ease of use of the electronic device 106 and allow the electronic device 106 to be conveniently stored in pockets, purses and on belt clips while occupying minimal space. Further, it is desirable to have the outer surface of the protective case 100 made of a material that can easily slide in and out of confined spaces, such as pockets, purses, etc. Typical soft covers, such as cushion cover 106, are made from silicone or other elastomeric materials that do not slide easily on surfaces, but rather, tend to cling to surfaces.

The protective case 100, illustrated in FIG. 2, has a slim profile as a result of the reduced thickness portions, such as reduced thickness portion 134, 136, 138, 140 (FIG. 6), 142. The curved flexible arms 108, 110, 112, 114 fit within the reduced thickness portions 134, 136, 138, 142 (FIG. 6) respectively, and reduce the overall size and profile of the protective case 100. Back 132 fits within the recessed thickness portion 140 on the back surface of the cushion cover 104. The back 132 of the outer shell 102 may be slightly thicker than the curved flexible arms 108-114 which provides greater stability for the protective case 100. In that regard, the rigid outer shell 102 provides structural stability for the protective case 100 that protects the electronic device 106 in addition to holding the cushion cover 104 in place on the electronic device 106. For example, the rigid outer shell 102 absorbs and disperses impacts to the cushion cover 104 across the contact surfaces between the rigid outer shell 102 and the cushion cover 104. In this fashion, a large portion of the cushion cover 104 is utilized to absorb shocks resulting from impacts to the rigid outer shell 102. Accordingly, the structural stability that is added by the rigid outer shell 102 maintains the cushion cover 104 in close contact with the electronic device 106, as well as absorbing and spreading impacts across the contact surfaces between the rigid outer shell 102 and the cushion cover 104.

Another beneficial advantage that the rigid outer shell 102 provides is that the density of the cushion cover 104 can be reduced which increases the softness of cushion cover 104 which, in turn, increases the ability of the cushion cover 104 to absorb shocks and impacts. As the density of the cushion cover 104 is increased, the conformability of the cushion cover 104 to the electronic device 106 increases. Accordingly, a higher density cushion cover 104 conforms better to the electronic device 106 than a cushion cover that is less dense. The elastomeric material, such as silicone, can be formed with different densities to create the desired amount of conformability. Of course, if the cushion cover 104 is made from a less dense material, the cushion cover 104 may have less conformability to the electronic device 106 so that the edge portions, such as edge portions 124-130 become separated from the electronic device 106, and gaps form between the edge portions 124-130 and the electronic device 106, especially over time. The disadvantage, however, with the use of a denser elastomeric material as a cushion cover 104 is that the denser material is not as soft as less dense material, and it does not absorb shocks as well as less dense material. By using a rigid outer shell 102, less dense material, that is better able to absorb shocks than denser materials, can be used since the rigid outer shell 102 securely holds the cushion cover 104 on a plurality of sides of the electronic device 106. In this manner, the absorbability of shocks by the cushion cover 104 is increased.

The rigid outer shell 102 can be made from a material, such as polycarbonate or other thermoplastic materials that have a smooth surface, which allows the protective case 100 to be easily placed in and removed from pockets, or other tight areas, without binding. Further, the rigid material of the outer shell 102 can be mixed with a fluorescing material so that the protective case 100 can be located more easily in light-restricted areas.

Figure 3:
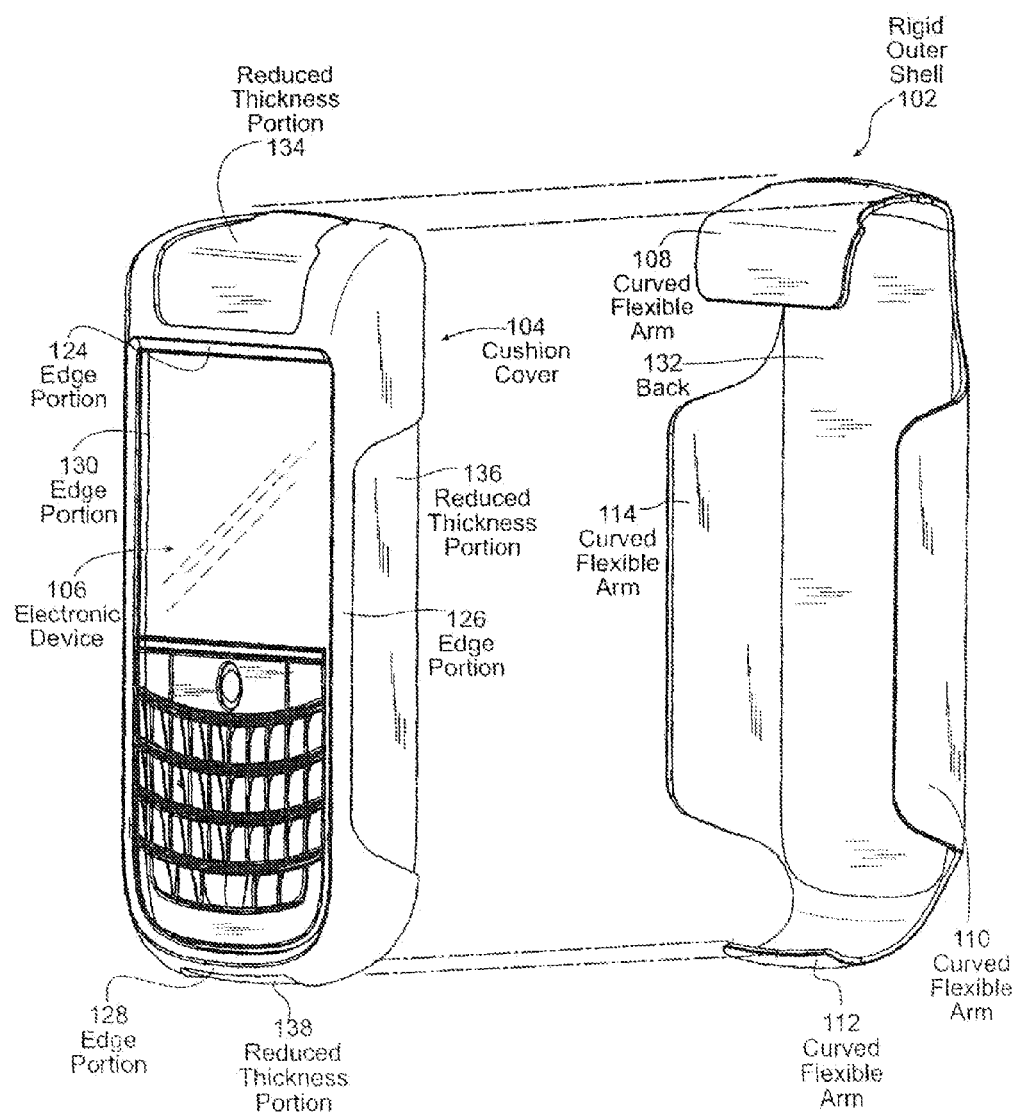
FIG. 3 is a partially exploded schematic perspective view of the embodiment that is illustrated in FIG. 1.

FIG. 3 is a schematic assembly view illustrating the rigid outer shell 102 and the electronic device 106 disposed within the cushion cover 104. As illustrated in FIG. 3, the curved flexible arms 108, 110, 112 fit in the reduced thickness portions 134, 136, 138, respectively. The remaining portions of the cushion cover 104 comprise thicker portions for impact protection for direct hits on cushion cover 104. The thickness of the cushion cover 104 in the thicker areas substantially matches the level of the curved flexible arms that are disposed in the reduced thickness portions. For example, when the rigid outer shell 102 is placed on the cushion cover 104, the curved flexible arm 110 is disposed within the reduced thickness portion 136. The outside surface of the curved flexible arm 110 substantially matches the outside surface of the edge portion 126 and the surrounding thicker portions of the cushion cover 104. The same is true with respect to the curved flexible arm 108 and the reduced thickness portion 134, the curved flexible arm 112 and the reduced thickness portion 138 and the curved flexible arm 114 and the reduced thickness portion 142. Hence, edge portion 124 is approximately on the same level with the outer surface of the curved flexible arm 108 around the edges of the curved flexible arm 108. Similarly, the edge portion 128 is at approximately the same level as the outer surface of the curved flexible arm 112. Further, edge portion 130 is approximately at the same level as the curved flexible arm 114. In this manner, a consistent outer surface of the protective case 100 is provided, so that the protective case 100 does not get caught on objects and can be easily placed in and removed from confined areas, such as pockets, purses, etc.

As illustrated in FIGS. 3-7, the protective case 100 is a two-part case, in which the cushion cover 104 is partially surrounded by the rigid outer shell 102. A primary purpose of the rigid outer shell 102 is to protect the electronic device 106 from a hit or blow from a sharp object, such as the corner of a desk, a rock, a countertop edge, a stair edge or other sharp object, and spread that blow or hit over the surface area of the rigid outer shell 102. The cushion cover 104 then functions to absorb the shock of the hit or blow, so that the shock from the hit or blow is not transferred directly to the electronic device 106. Hence, if the assembly of the protective case 100 and electronic device 106 is dropped on a sharp object, and the curved flexible arms 108-114 or back 132 are impacted by the sharp object, the rigid outer shell 102 absorbs the impact and spreads that impact over the surface of the rigid outer shell 102 and transmits the shockwaves from the impact to the cushion cover 104, rather than to the electronic device 106.

Figure 4:
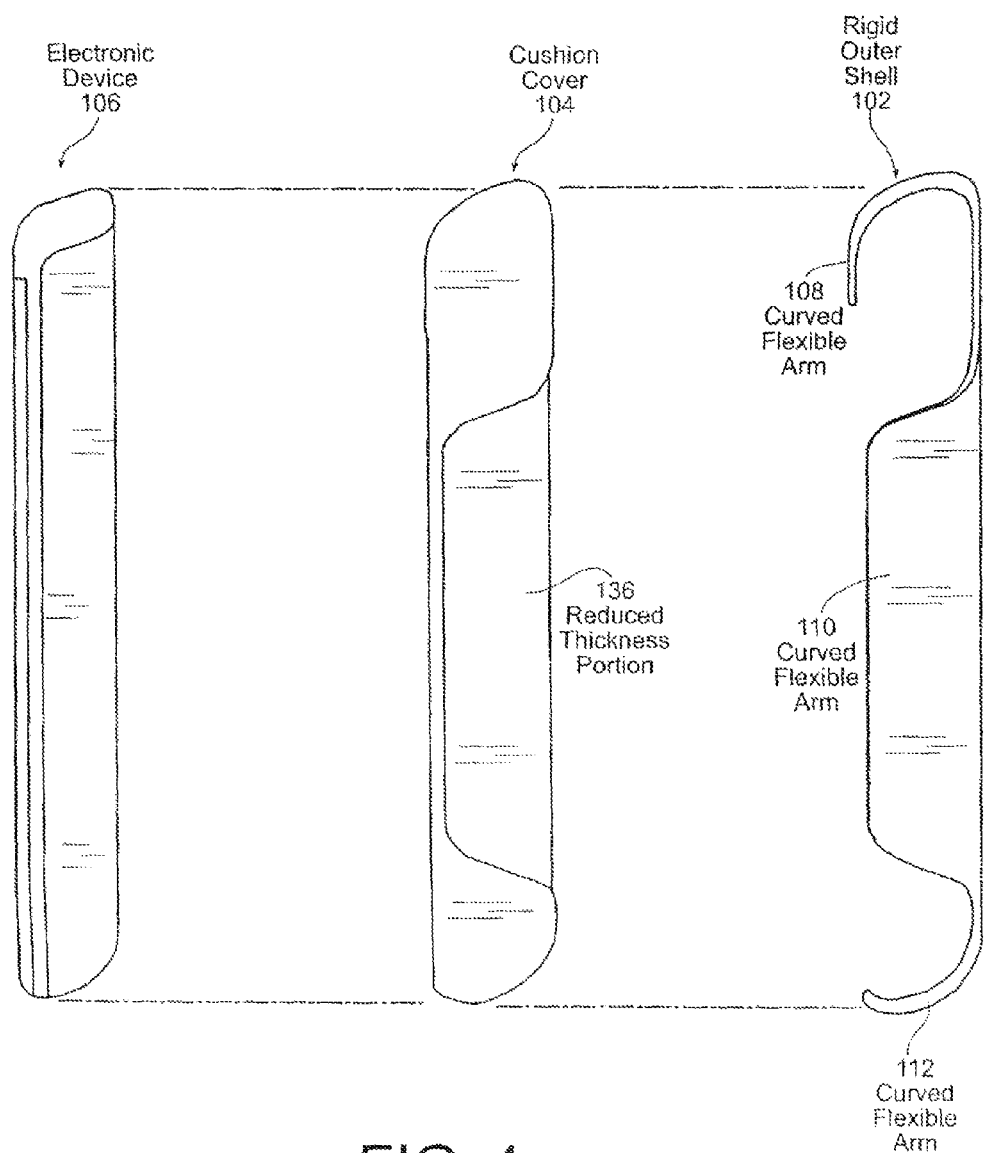
FIG. 4 is a side exploded view of the embodiment of FIG. 1.

FIG. 4 is a side exploded view illustrating the rigid outer shell 102, the cushion cover 104, and the electronic device 106. As shown in FIG. 4, the curved flexible arms 108, 112 fit over the top and bottom, respectively, of the cushion cover 104. Curved flexible arm 110 fits within the reduced thickness area 136. During assembly, the electronic device 106 is first placed within the cushion cover 104. The assembly of the electronic device 106 and cushion cover 104 are then inserted within the rigid outer shell 102. Again, the curved flexible arms 108-114 are capable of flexing and bending sufficiently to allow the assembled electronic device 106 and cushion cover 104 to be inserted within the rigid outer shell 102.

Figure 5:
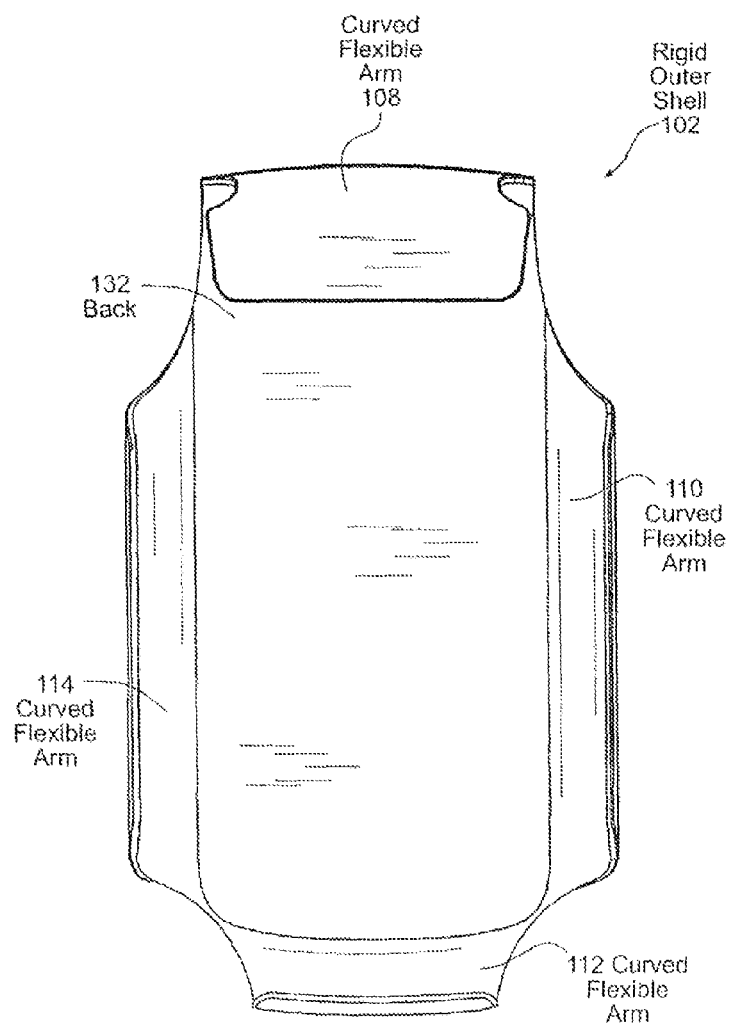
FIG. 5 is a schematic front view of the embodiment of the rigid outer shell illustrated in FIG. 1.

FIG. 5 is a front view of the rigid outer shell 102. As shown in FIG. 5, each of the curved flexible arms 108-114 is connected to the back 132 of the rigid outer shell 102. The curved flexible arms 108-114 have a sculptured shape that provides a smooth outer surface for the user. The curved sculptured shape of the curved flexible arms 108-114 provides for a slim profile and smooth gripping surface without sharp edges extending from the rigid outer shell 102.

Figure 6:
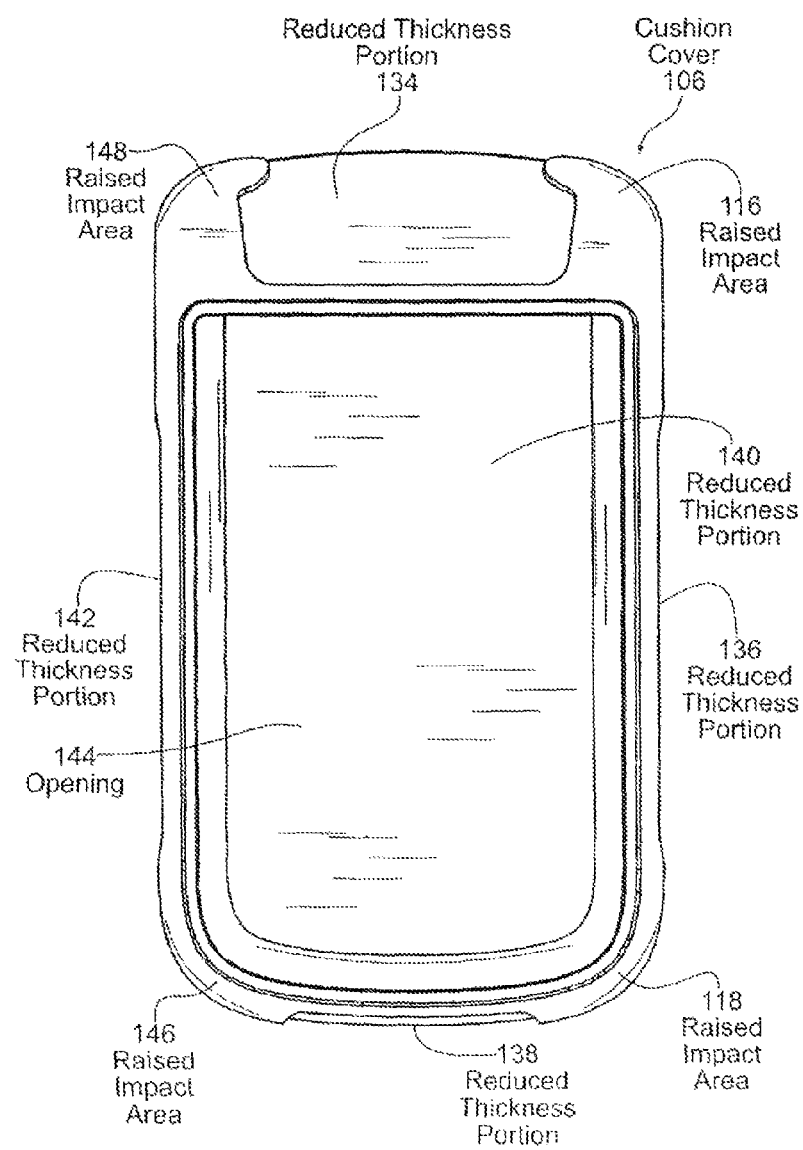
FIG. 6 is a schematic front view of the embodiment of the cushion cover illustrated in FIG. 1.

FIG. 6 is a front view of the cushion cover 106. As illustrated in FIG. 6, the reduced thickness portions 134, 136, 138, 140, 142 are surrounded by the raised impact areas 116, 118, 146, 148. The cushion cover 106 also has a front opening 144 that allows the electronic device 106 to be inserted in, and removed from, the cushion cover 106. In the embodiment of FIG. 6, the back portion of the cushion cover 106 that intersects the back 132 of the outer rigid shell 102 is a reduced thickness portion. The reduced thickness portion 140 of the cushion cover 106 can have raised impact areas that can protrude through openings in the back 132 of the rigid outer shell 102 to provide an additional raised impact area on the back of the protective case 100.

Figure 7:
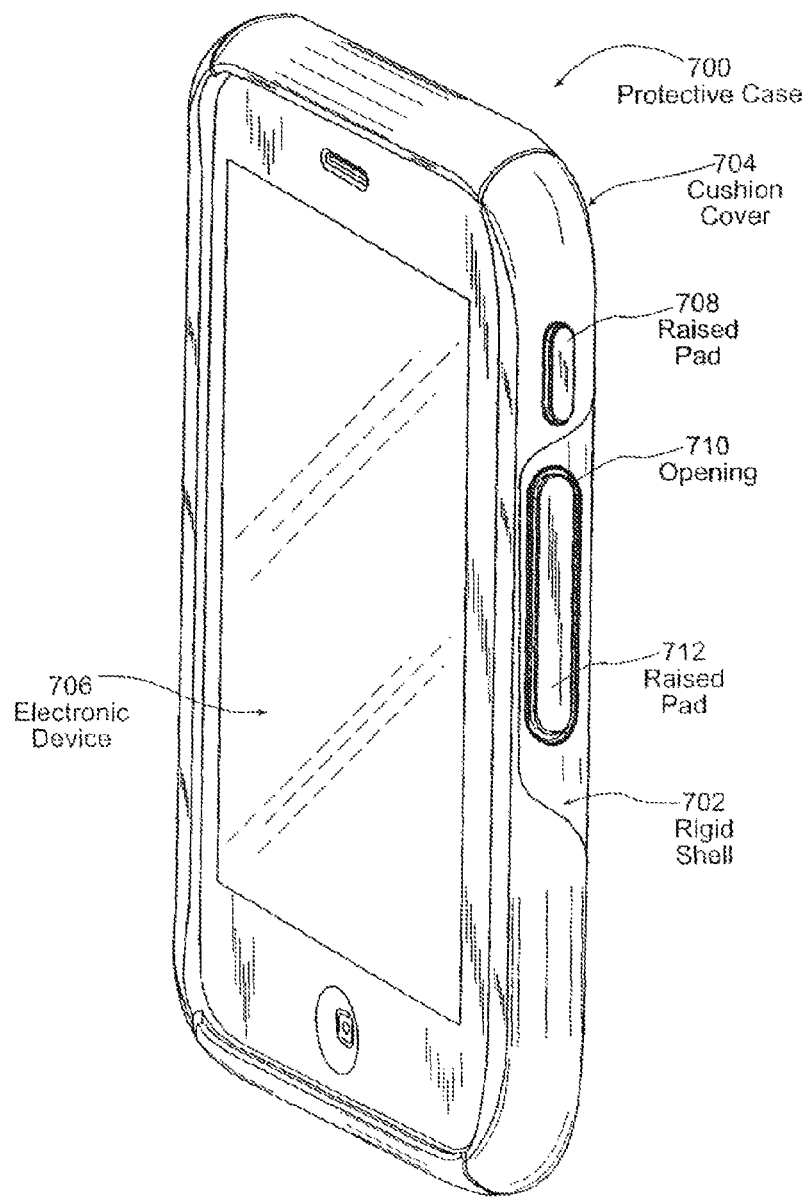
FIG. 7 is a schematic perspective view of another embodiment of a protective case.

FIG. 7 is a schematic perspective view of another embodiment of a protective case 700. As shown in FIG. 7, the rigid shell 702 has an opening 710, which allows access to a raised pad 712. The raised pad 712 is part of the cushion cover 704 which interacts with controls on the electronic device 706. Hence, the rigid shell 702 can be placed in areas that are aligned with interactive controls on the electronic device 706 and still allow interaction with those controls on the electronic device 706 by providing openings in rigid shell 702. A similar raised pad 708 is shown on the cushion cover 704 that is not surrounded by the rigid shell 702.

Figure 8:
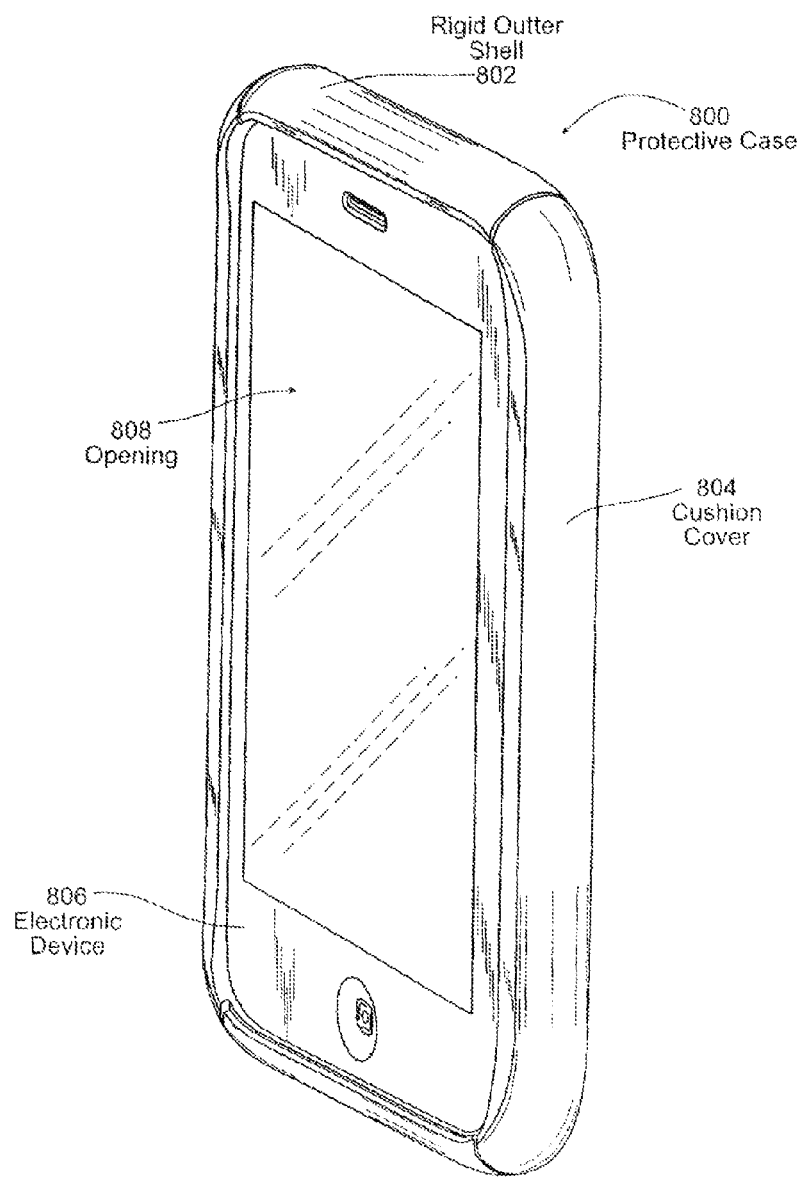
FIG. 8 is a schematic perspective view of another embodiment of a protective case.

FIG. 8 is a schematic perspective view of another embodiment of a protective case 800. As shown in FIG. 8, a protective case 800 surrounds an electronic device 806, such as a smartphone. The protective case 800 comprises a rigid outer shell 802 that surrounds a cushion cover 804. The rigid outer shell 802 is tightly secured to the upper and lower portions of the electronic device 806 over the cushion cover 804. The cushion cover 804 surrounds the electronic device 806 and has a front opening 809 that exposes the front portion of the electronic device 806.

Figure 9:
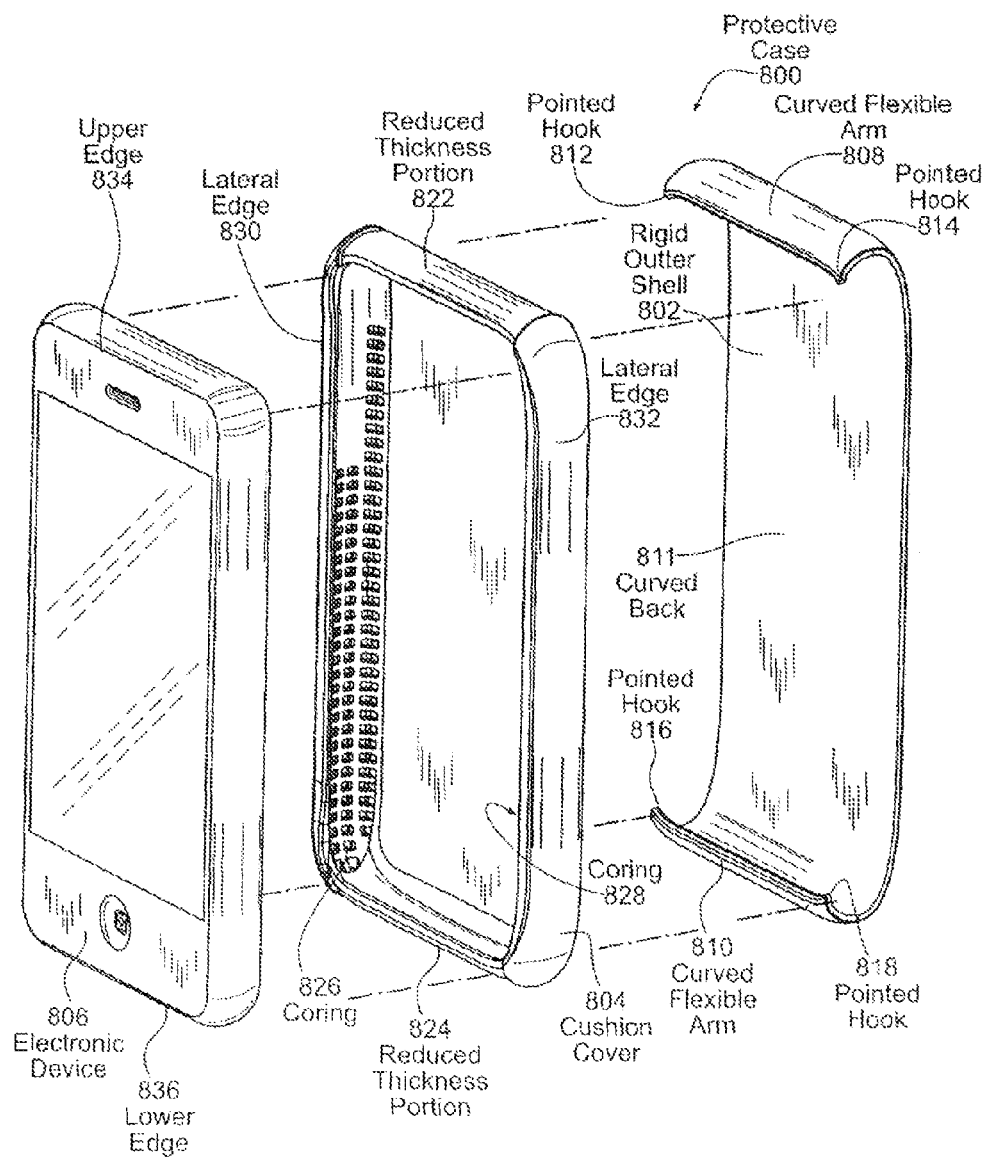
FIG. 9 is an assembly view of the embodiment of FIG. 8.

FIG. 9 is an assembly view of the protective case 800 and the electronic device 806. As shown in FIG. 9, the rigid outer shell 802 has a curved flexible arm 808 on an upper portion of the rigid outer shell 802 and a curved flexible arm 810 on a bottom portion of the rigid outer shell 802. A curved back portion 811 connects the curved flexible arm 808 and curved flexible arm 810 to form the rigid outer shell 802 as a single structure. Curved flexible arm 808 has a pointed hook 812 on one side of the curved flexible arm 808 and a pointed hook 814 on the other side of the curved flexible arm 808. Similarly, pointed hook 816 and pointed hook 818 are on opposite sides of the curved flexible arm 810.

FIG. 9 also illustrates the cushion cover 804. Cushion cover 804 has a reduced thickness portion 822 that is engaged by the curved flexible arm 808 of the rigid outer shell 802. Similarly, reduced thickness portion 824 is engaged by the curved flexible arm 810 of the rigid outer shell 802. The pointed hooks 812-820 engage the surface of the reduced thickness portions 822, 824 adjacent the surface of the electronic device 806. In this manner, the rigid outer shell 802 securely holds the reduced thickness portions 822, 824 of the cushion cover 804 securely to the electronic device 806. Since the pointed hooks 812-820 are able to grasp and hold the reduced thickness portions 822, 824 and securely hold the cushion cover 804 to the electronic device 806, most of the face of the electronic device 806 can be exposed through the front opening in the protective case 800.

Alternatively, the pointed hooks 812-820 can engage the upper edge 834 of the electronic device 806 and securely hold the rigid outer shell 802 to the electronic device 806. Similarly, pointed hooks 816, 820 can engage the lower edge 836 of the electronic device 806 and securely hold the bottom portion of the rigid outer shell 802 to the electronic device 806. Since these hooks are able to grasp the electronic device 806 at the upper edge 834 and the lower edge 836 in this alternative embodiment, most of the face of the electronic device 806 is also exposed through the front opening in protective case 800.

As also shown in FIG. 9, the cushion cover 804 is made from a soft material as described above and form fit to fit the outer surface of the electronic device 806. The cushion cover 804 is stretchable and can be made of a variety of thermoset materials, such as synthetic rubber, silicone, urethane or other materials that are capable of stretching sufficiently to allow the electronic device 806 to slide into the front opening of the cushion cover 804. The elasticity of the cushion cover is sufficient to allow the protective cover to easily conform to the electronic device 806 and allow the electronic device 806 to tightly fit within the protective cover 102.

As further illustrated in FIG. 9, lateral edges 830, 832 are thicker on the sides of cushion cover 804 in comparison to the reduced thickness portions 822, 824. The top surface of the cushion cover 804 that adjoins the front face of the electronic device 808 is beveled, so that the height of the cushion cover 804 adjacent the front face of the electronic device 806 nearly matches the height of the face of the electronic device 806. The low profile of the cushion cover 804 adjacent the front face of the electronic device 806 allows easy user accessibility for entering data, including texting and typing of data. Lateral edge 830 includes coring 826, while lateral edge 832 has a similar coring 828 (not shown). Coring 826, 828 allows a denser material to be used as a cushion cover 804 to provide a high degree of elasticity and formability of the cushion cover 804 to the electronic device 806 while providing enhanced cushioning and shock absorbing on the lateral edges 830, 832, as explained in more detail below. Also, the denser material has better durability and elasticity than less dense material. The rigid outer shell 802 provides a smooth, curved surface that does not substantially cover the face of the electronic device 806 and allows a user substantially full access to the front surface of the electronic device 806 while securely connecting both the cushion cover 804 and the rigid outer shell 802 to the electronic device 806. As disclosed above, the rigid outer shell can be constructed of polycarbonate, nylon, ABS, or the like, and alloys thereof, or other similar material that can bend without breaking. This material can be mixed with a fluorescent material so that the rigid outer shell 802 can be located in dim light conditions.

In order to achieve the results of providing a protective covering that is thin and conforms well to the electronic device, while having thicker, softer portions in impact areas, such as corners and lateral side edges, it would appear that two different types of material would be required. The use of two different types of materials, that are either welded together or layered, would substantially increase the cost of a protective cover because of the increased manufacturing costs resulting from the complexity of the manufacturing processes for forming protective covers that are made from more than one material, in addition to the added cost of using two different materials.

Alternatively, the embodiments disclosed herein provide the cushioning that would otherwise by provided by a softer, thicker material, while utilizing a single, denser material. The cushion cover 104, 804 is made from a material that has a density that allows the protective cover to conform well to the electronic device 106, 806, while also providing thicker, raised portions in impact areas, such as the corners, that simultaneously prevent an impact with a hard surface from being transmitted directly to the electronic device 106, 806, as a result of the cushion cover 108, 804 being compressed in the impact area, as well as being sufficiently soft to absorb and prevent the transfer of energy through the cushion cover 104, 804 to the electronic device 106, 806. In this manner, denser materials can provide protection that is equivalent to the protection provided by thicker, less dense materials to protect against the transfer of an impact directly to the electronic device resulting from compression of the protective cover material. In that regard, thinner, denser materials are more advantageous for a protective cover, since they provide a slimmer profile than thicker, less dense materials that provide equivalent impact protection.

The coring 826, 828 includes a plurality of recesses. Between each adjacent recess is a rib. Hence, a plurality of recesses and ribs are provided along the lateral edges 830, 832. The recesses form the ribs which provide a softer, more flexible area in the corner portions and other impact zones that absorb the shock of impact. Of course, any portion of the protective cushion cover 804 that needs impact protection can utilize coring, and the coring is not limited to being disposed on the lateral edges 830, 832. The ribs provide support for the lateral edges 830, 832, while the recesses and ribs allow the lateral edges 830, 832 to compact and absorb energy from impacts. In this fashion, the lateral edges 830, 832 are softer, even though the material used for the enlarged corner portions is a denser material. The recesses allow compression of the ribs into the recess portions, so as to absorb shock and energy from impacts. The size of the ribs, with respect to the size of the recesses, can be varied to vary the amount of compression that occurs so that shocks occurring in drop situations are absorbed.

Figure 10:
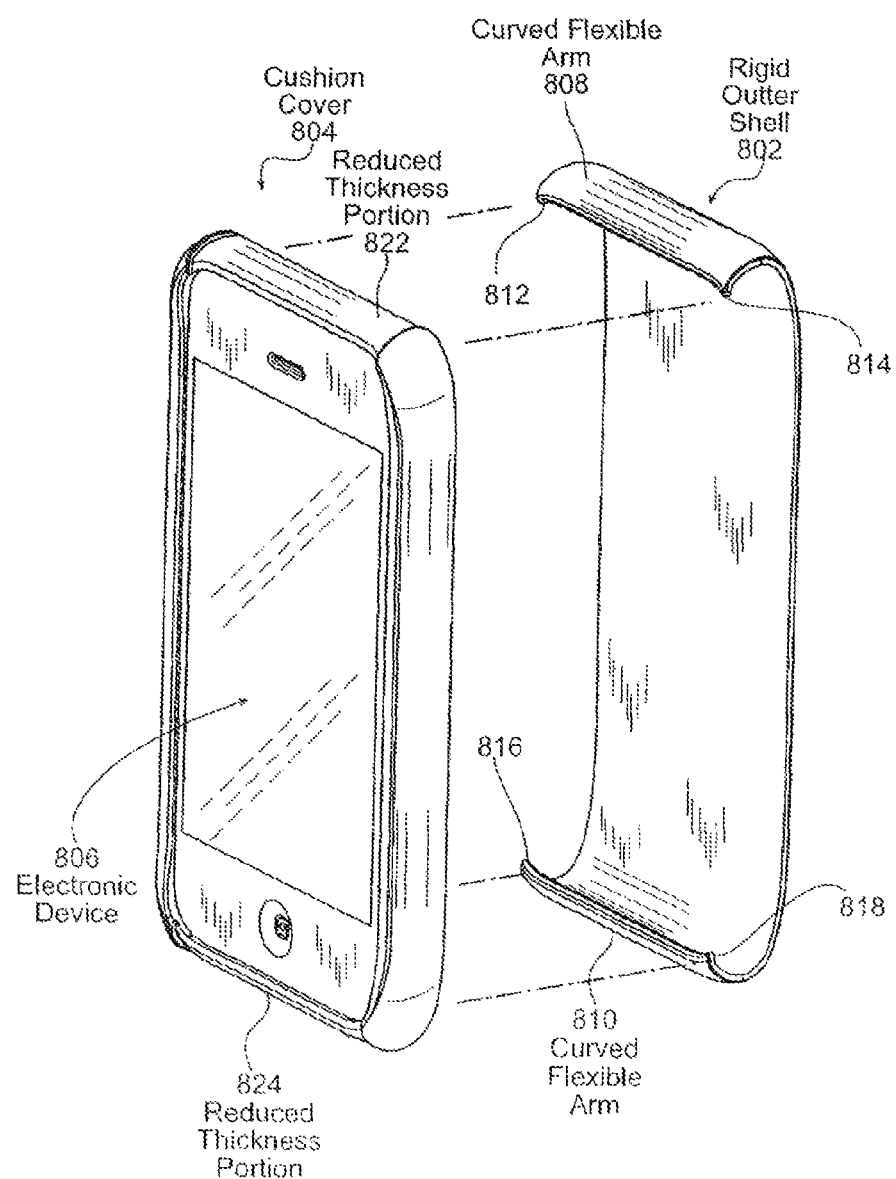
FIG. 10 is an assembly view of the embodiment of FIGS. 8 and 9.

FIG. 10 is an assembly view illustrating the manner in which the rigid outer shell 802 is mounted on the cushion cover 804, which is mounted on the electronic device 806. As shown in FIG. 10, the cushion cover has the reduced thickness portions 822, 824 that are engaged by the curved flexible arms 808, 810, respectively. The curved flexible arms 808, 810 surround and clamp onto the reduced thickness portions 822, 824. The curved flexible arms 808, 810 are secured to the cushion cover 804 and electronic device 806. Forces created by the pointed hooks 812-818 on the cushion cover 804 assist in holding the cushion cover 804 to the electronic device 806. The force generated by the curved flexible arms 808, 810 on the reduced thickness portions 822, 824 is a result of the elasticity of the curved arms 808, 810.

Figure 11:
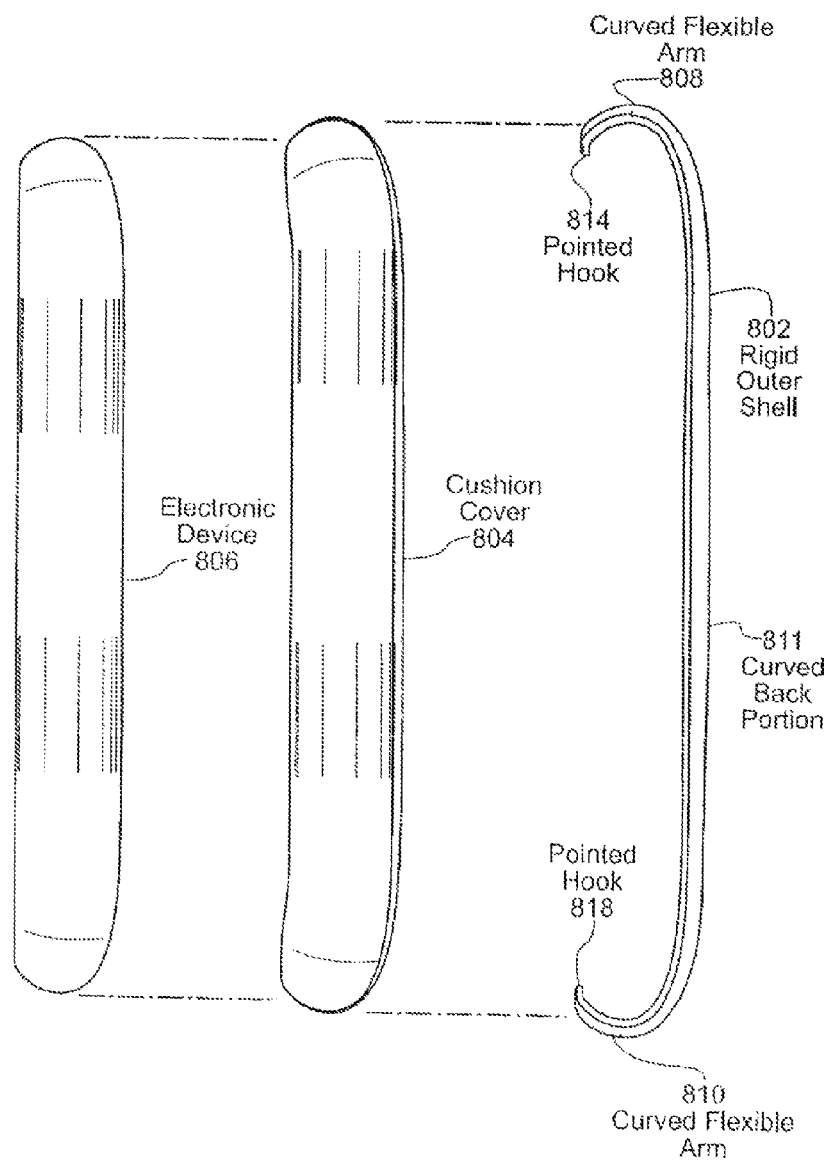
FIG. 11 is a side assembly view of the embodiment of FIGS. 8 through 10.

FIG. 11 is a side assembly view of the embodiment of FIGS. 8-10. As shown in FIG. 11, the electronic device 806 fits within the cushion cover 804. The cushion cover 804 fits within the rigid outer shell 802. The curved flexible arms 808, 810 have pointed hooks, such as pointed hooks 814, 818 that engage the cushion cover 804.

Figure 12:
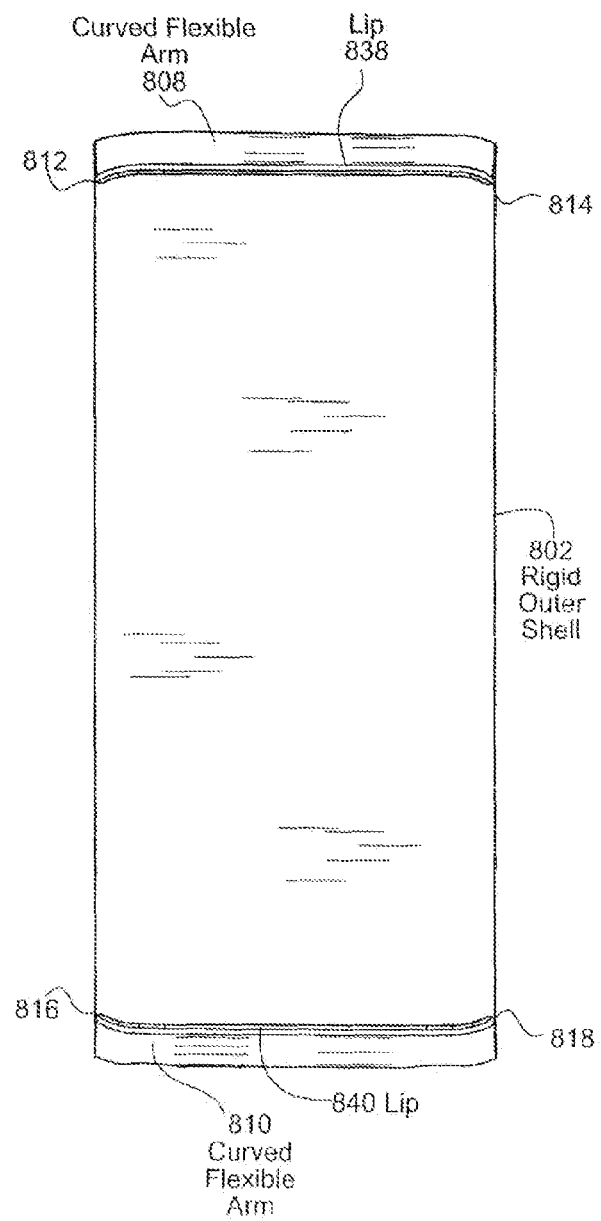
FIG. 12 is a front view of the rigid outer shell of the embodiment of FIG. 8.

FIG. 12 is a front view of the rigid outer shell 802. As shown in FIG. 12, curved flexible arm 808 includes a lip 838, which engages and attaches to the cushion cover 804. Similarly, curved flexible arm 810 has a lip 840 that engages and attaches to the cushion cover 804. In this manner, the pointed hooks 812, 814, 816, 818, as well as the lips 838, 840, assist in securing both the rigid outer shell 802 and the cushion cover 804 to the electronic device 806.

Figure 13:
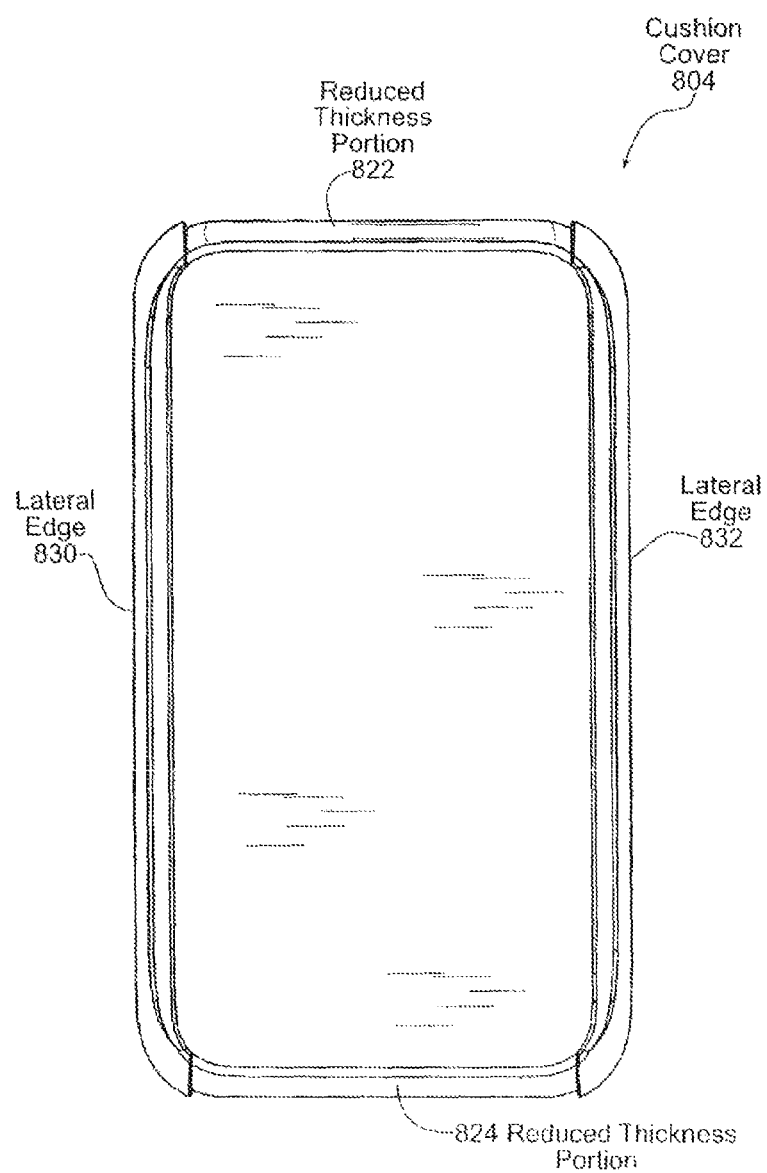
FIG. 13 is a front view of the cushion cover of the embodiment of FIG. 8.

FIG. 13 is a front view of the cushion cover 804 of the embodiment of FIG. 8. As shown in FIG. 13, the reduced thickness portions 822, 824 are disposed between the lateral edges 830, 832. Again, the lateral edges 830, 832 are not covered by the rigid outer shell 802 and provide a gripping surface for the user of the protective case.

Figure 14:
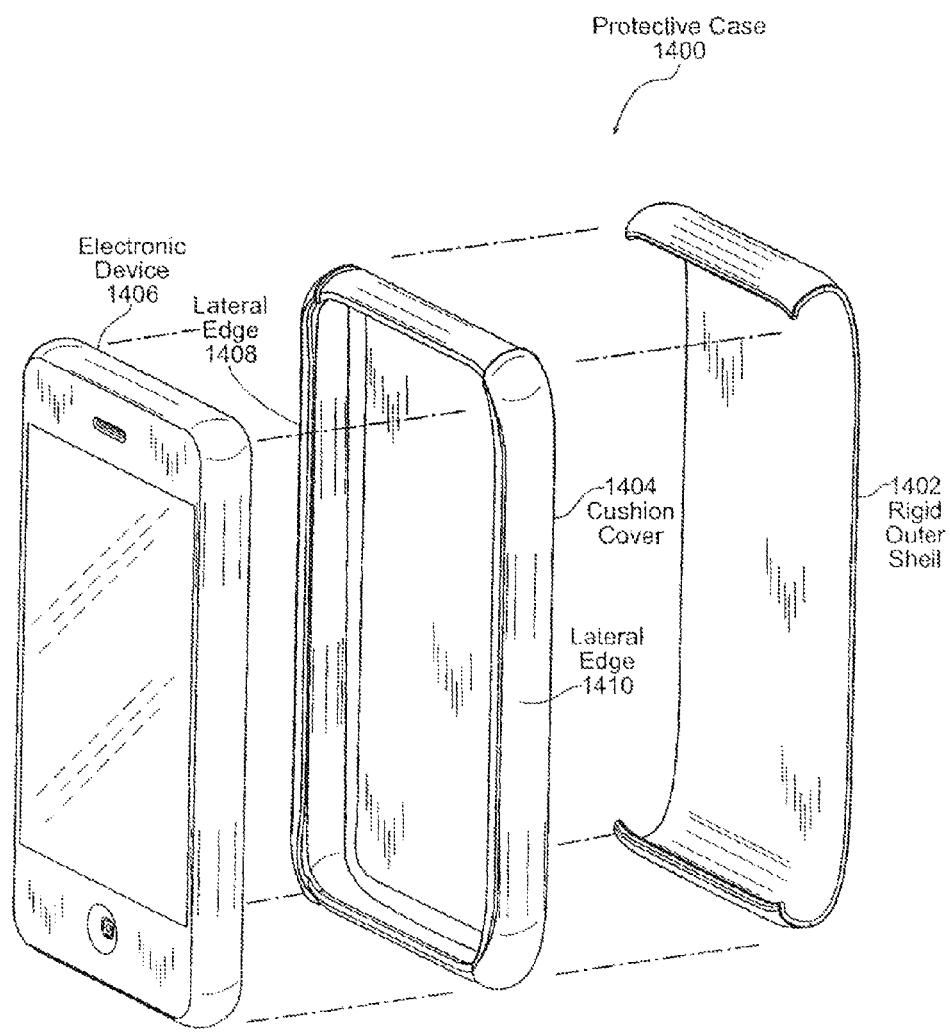
FIG. 14 is an assembly view of another embodiment of a protective case.

FIG. 14 is an assembly view of another embodiment of a protective case 1400. As shown in FIG. 14, the protective case includes a cushion cover 1404 that fits within the rigid outer shell 1402. The electronic device 1406 fits within the cushion cover 1404. As illustrated in FIG. 14, the lateral edges 1408, 1410 do not include any coring. These lateral edges may be slightly thicker than the remaining portion of the cushion cover 1404 to provide additional cushioning. In addition, the cushion cover 1404 may be made of a softer material to add additional cushioning.

Figure 15:
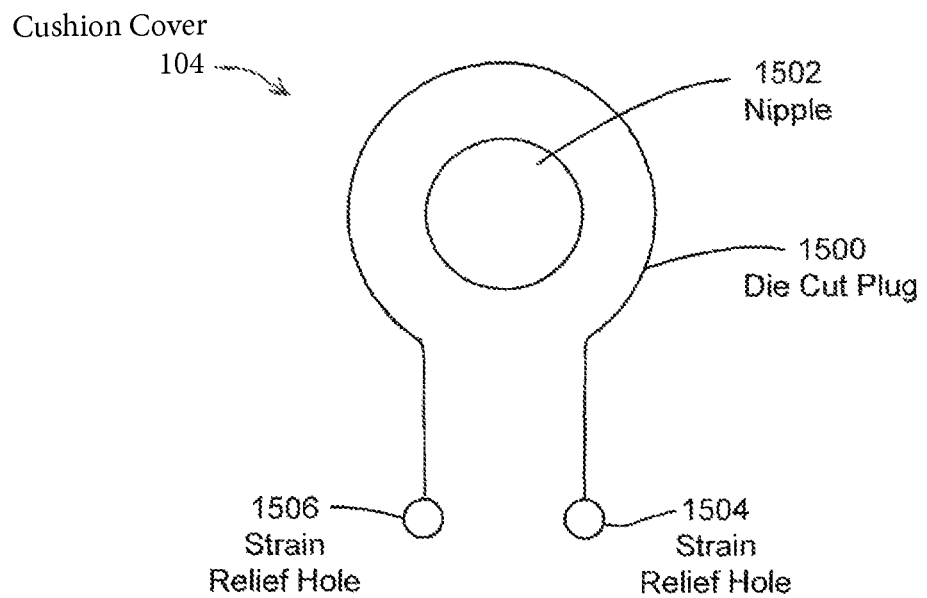
FIG. 15 is a front view of an embodiment of a die cut plug.

FIG. 15 is a front view of a die cut plug 1500. Die cut plug 1500 is cut from the cushion cover and provides an opening in the cushion cover to access an electrical plug, such as a headphone plug. The die cut plug 1500 has a nipple 1502 that is a generally cylindrical shape and extends outwardly from the surface of the die cut plug 1500. The nipple 1502 is disposed on the die cut plug 1500 to be inserted in an opening, such as a headphone opening in the handheld electronic device 106. Strain relief hole 1504 and strain relief hole 1506 are also cut in the cushion cover 104 adjacent the cuts for the die cut plug 1500. The strain relief holes 1504, 1506 provide a round, smooth area, which intersects the cuts made for the die cut plug 1500 to prevent the cushion cover 104 from ripping. The additional surface area and smooth transition of the die cut to round strain relief holes 1504, 1506, assists in preventing the cushion cover 104 from ripping at the end of each die cut of the die cut plug 1500.

Figure 16:
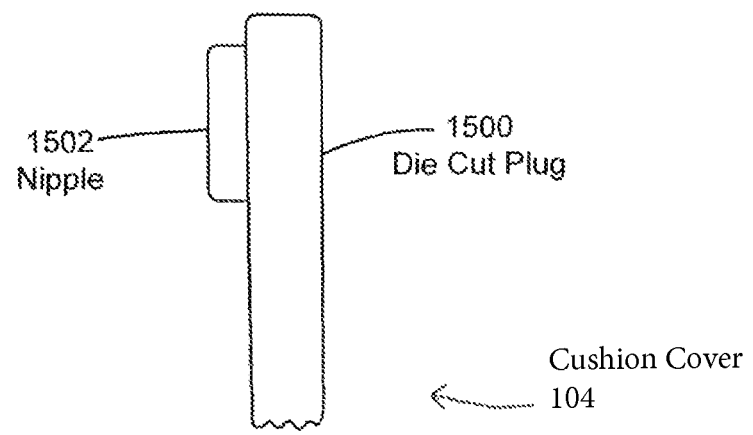
FIG. 16 is a side view of the embodiment of the die cut plug of FIG. 15.

As shown in FIG. 16, nipple 1502 forms a part of the cushion cover that is cut to form the die cut plug 1500. The nipple 1502 is formed when the cushion cover 104 is formed. Nipple 1502 is located on the cushion cover 104 so that the nipple 1502 can be inserted in an opening in the electronic device 106, such as a headphone jack. The nipple 1502 has a depth and width that allows the nipple to easily slip into the headphone jack opening in the electronic device 106 and hold the die cut plug 1500 in place.

Figure 17:
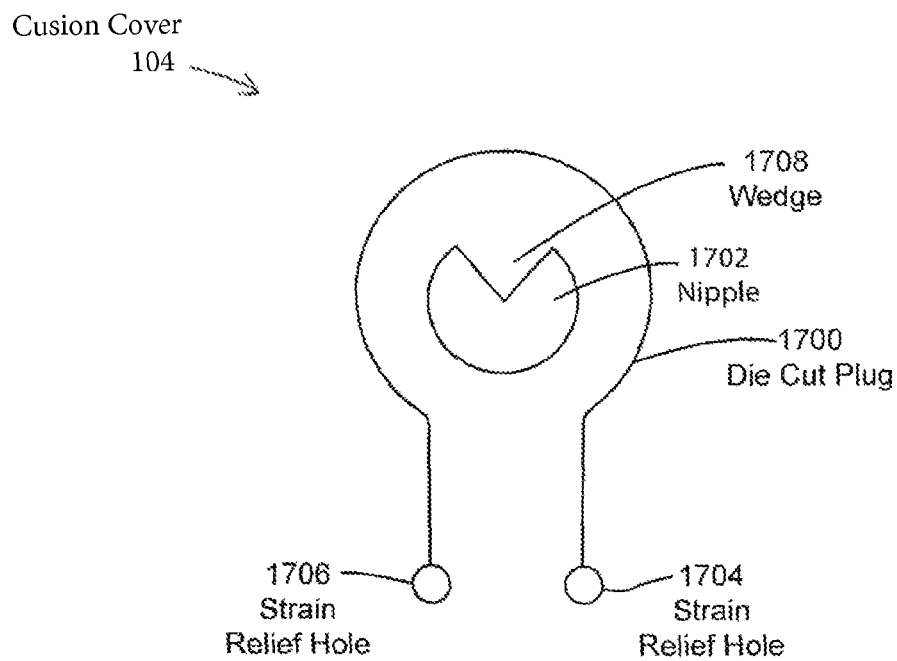
FIG. 17 is a front view of another embodiment of a die cut plug.

FIG. 17 is a front view of a die cut plug 1700. Die cut plug 1700 has a nipple 1702 that has a wedge 1708 removed from the nipple 1702. In some electronic devices 106, mechanical arms are present in an opening, such as a headphone jack that sense the presence of a headphone and switch the electrical signals from the speaker to the headphone jack. These mechanical sensors may be disposed along one side of the headphone jack in the electronic device 106. The wedge 1708 is removed from the nipple 1702 in the location where the nipple 1702 would otherwise engage the mechanical sensors in the electronic device 106 that sense a plug in the headphone jack. The removal of the wedge 1708 from the nipple 1702 allows the nipple 1702 to be inserted in the headphone jack in the electronic device 106 without activating the mechanical switches in the headphone jack. FIG. 17 also illustrates the strain relief hole 1704, 1706 that assist in preventing rips and tears in the cushion cover 104.

Figure 18:
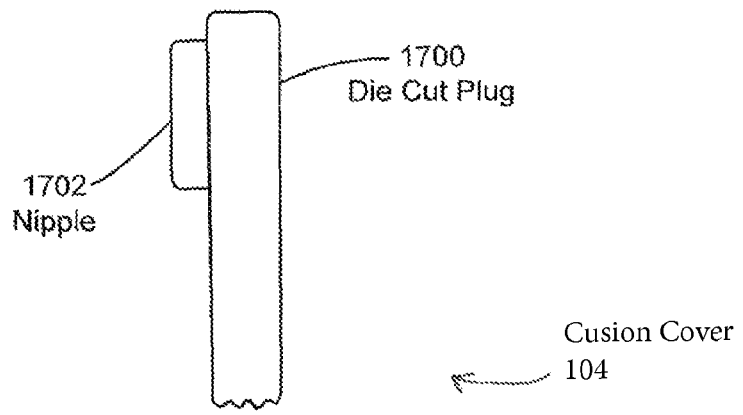
FIG. 18 is a side view of the embodiment of the die cut plug of FIG. 17.

FIG. 18 is a side view of the die cut plug 1700. As shown in FIG. 18, the nipple 1702 extends a predetermined distance and has a predetermined size to fit within an opening in the electronic device 106. The nipple 1702 holes the die cut plugs in position on the electronic device 106.

Figure 19:
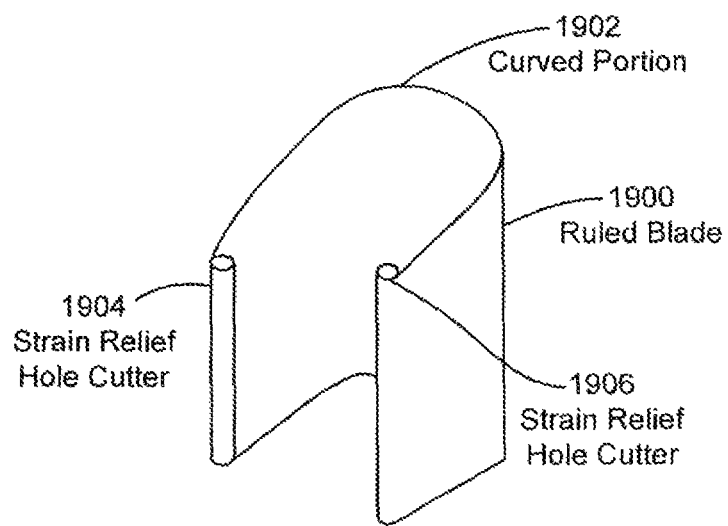
FIG. 19 is a perspective view of an embodiment of a ruled blade.

FIG. 19 is a perspective view of a ruled blade 1900 that is used to cut the cushion cover 104 to create the die cut plug 1500, illustrated in FIG. 15. The ruled blade 1900 is bent into the desired shape to form the die cut plug 1500 and has a curved portion 1902. The ruled blade 1900 is also bent to form the strain relief hole cutter portion 1904 and the strain relief hole cutter portion 1906. In operation, the ruled blade 1900 has a sharp edge that is pressed against the cushion cover 104 and cuts the cushion cover 104 in the shape of the ruled blade 1900. By process creates the die cut plug 1500 that is illustrated in FIG. 15. Since a ruled blade is used to cut the cushion cover, little or no material is removed from the cushion cover so that when the die cut plug 1500 and the other die cut plugs disclosed herein are in a closed position, there is no gap between the die cut plug and the cushion cover, which stops the entry of dust and dirt into the interior portion of the cushion cover. Die cut plugs that are cut by a laser leave a gap, which allows water and dirt to easily enter the interior portion of the die cut cover.

Figure 20:
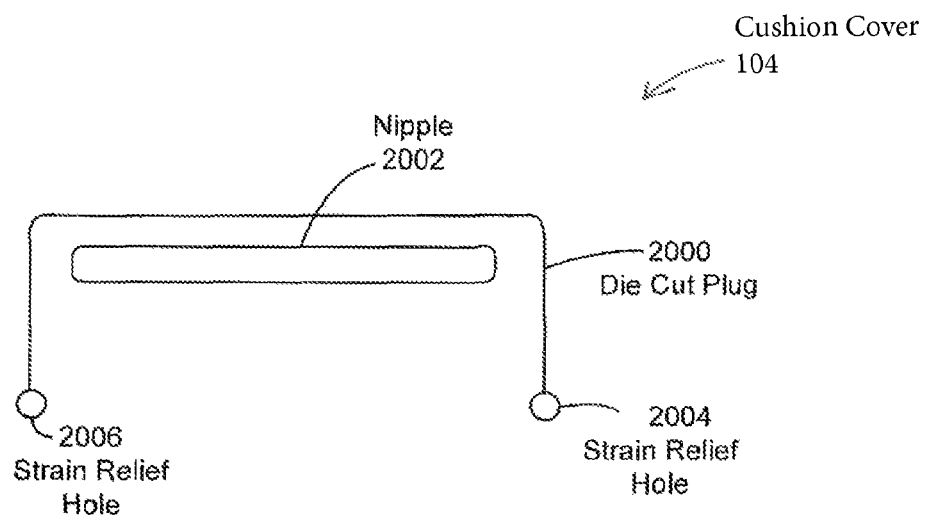
FIG. 20 is a front view of another embodiment of a die cut plug.
Figure 21:
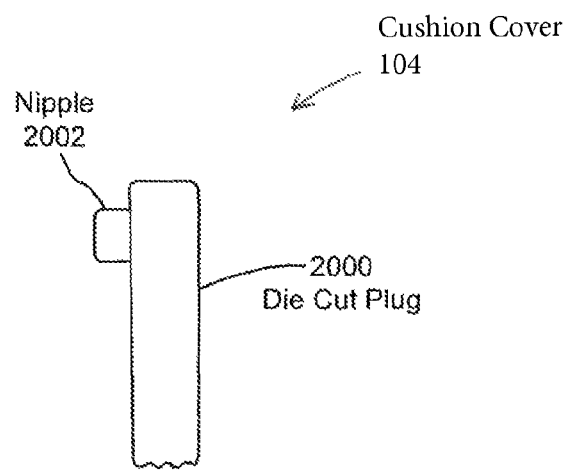
FIG. 21 is a side view of the embodiment of the die cut plug illustrated in FIG. 20.

FIG. 20 is a front view of another embodiment of a die cut plug 2000. Die cut plug 2000 has a rectangular shape, as illustrated in FIG. 20. Nipple 2002, as shown in FIGS. 20 and 21, extends outwardly from the die cut plug 2000. The nipple 2002 has a shape and size that fits into a port on the electronic device, such as a USB port or a proprietary port. The die cut plug 2000 has strain relief holes 2004, 2006 that reduce strain on the cushion cover so that the cushion cover does not rip when the die cut plug 2000 is pulled outwardly.

Figure 22:
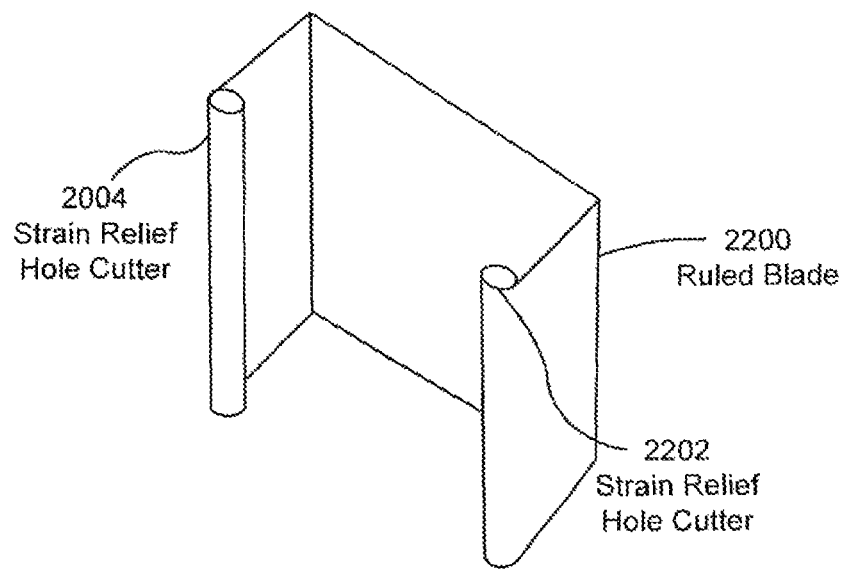
FIG. 22 is a perspective view of another embodiment of a ruled blade.
Figure 23:
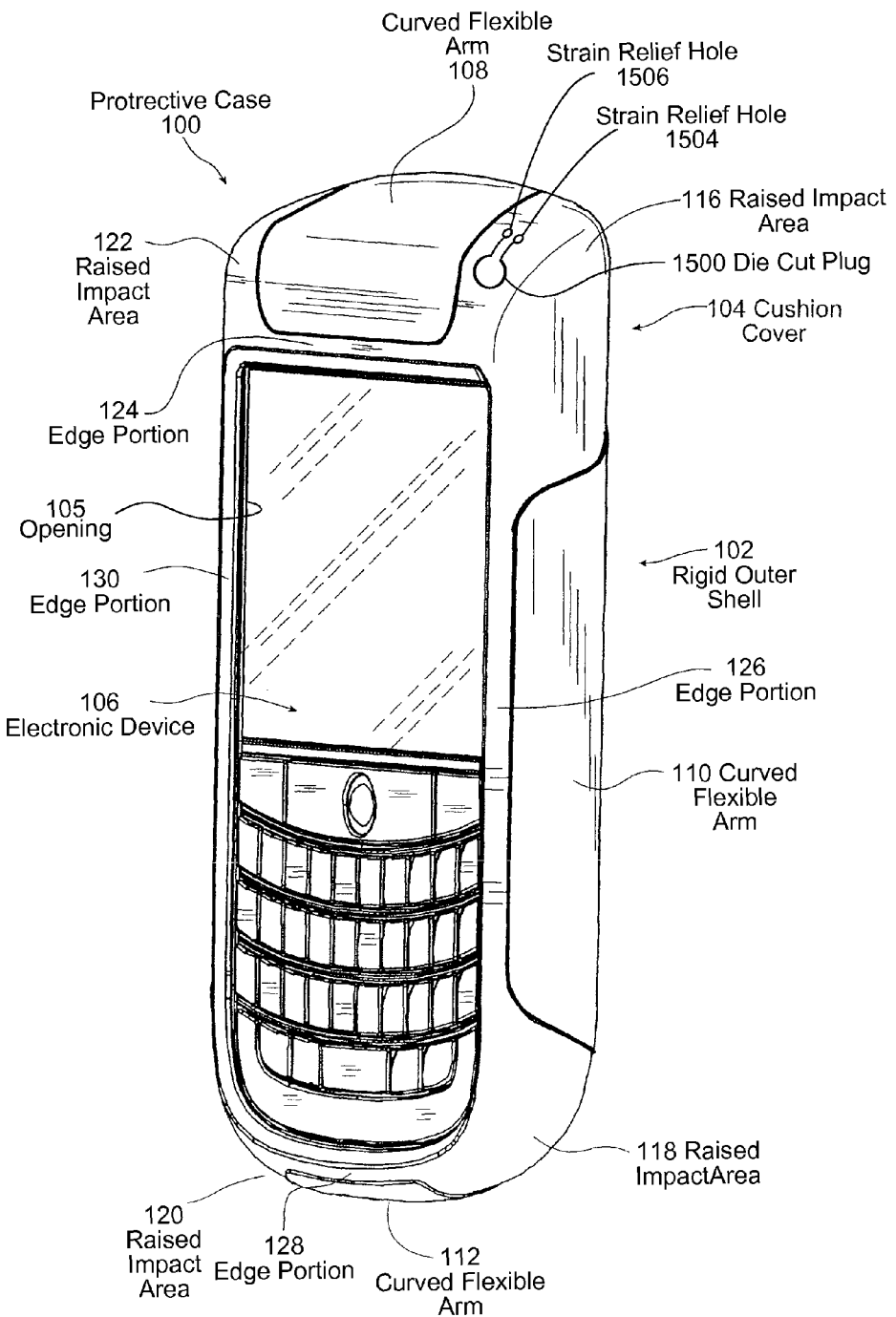
FIG. 23 is a perspective view of the protective covering system of FIG. 1 with a die cut plug, as shown in FIG. 15, located in the cushion cover of the protective covering system.

FIG. 22 is a perspective view of a ruled blade 2200 that can be used to cut the die cut plug 2000 in the cushion cover. The ruled blade 2200 is bent in the desired shape to form the die cut plug 2000. For example, FIG. 22 illustrates that the ruled blade 2200 is formed in a rectangular shape that has strain relief hole cutters 2202, 2204 that cut the strain relief holes 2004, 2006 respectively. Again, the cushion cover, such as cushion cover 104, is placed in a holder, so that the ruled blade 2200 can be lowered onto the cushion cover to cut the cushion cover. The holder may be made of a material that will not substantially dull the ruled blade 2200 during the cutting process.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A protective case for an electronic device, the protective case comprising:
   an outer shell having:
      a back portion, and
      a plurality of curved arms connected to the back portion, the curved arms configured to engage a cushion cover on at least two surfaces and having pointed hooks that engage said cushion cover at edge portions of said electronic device, said outer shell formed of a plastic material that resiliently bends sufficiently during installation to engage said cushion cover without breaking, wherein each of said plurality of curved flexible arms is configured to generate a force on a different respective one of said at least two surfaces of said cushion cover; and
   said cushion cover comprising:
      elastomeric material that is form-fitted to cover a portion of said electronic device, said cushion cover having a density and elasticity that causes said cushion cover to conform to said electronic device,
      reduced thickness portions disposed in predetermined areas of said cushion cover, said plurality of curved flexible arms disposed in, and engaged with, said reduced thickness portions such that said force generated by said plurality of curved flexible arms is coupled through said reduced thickness portions to said electronic device, raised impact portions located adjacent to said reduced thickness portions, said raised impact portions having a predetermined thickness, coring comprising ribs disposed between recesses formed in said raised impact portions, said ribs and recesses configured to allow said cushion cover to compress and absorb said impacts, and a die cut plug formed in said cushion cover and comprising a nipple extending from an inner surface of said die cut plug, said nipple having a generally cylindrical shape, wherein said die cut plug can be opened to provide access to a headphone jack on said electronic device and said nipple is configured to be inserted into said headphone jack, wherein said outer shell is configured to disperse an impact to said cushion cover across a contact surface of said cushion cover, said pointed hooks engage said cushion cover at two edge portions located at longitudinal ends of said electronic device so that said outer shell extends along a back surface of said cushion cover in a longitudinal direction along said electronic device and said lateral edges of said cushion cover are not covered by said outer shell, said outer shell is made from a material that is smooth so that said protective case easily slides into and out of confined areas, and said elastomeric material of said cushion cover on said lateral edges forms a gripping surface for said protective case.

2. The protective case of claim 1 wherein said predetermined thickness of said raised impact portions is sufficient to absorb impacts and prevent shocks from said impacts from being transferred to said electronic device.

3. The protective case of claim 1 further comprising a fluorescing material disposed in said outer shell that fluoresces so that said protective case can be located in low light conditions.

4. The protective case of claim 1 wherein said die cut plug has cut edges that have been cut by a blade that does not substantially remove material from said cushion cover so that said die cut plug fits tightly in said cushion cover.

5. The protective case of claim 4 wherein said cut edges of said die cut plug adjoin strain relief openings that reduce ripping of said die cut plug from said cushion cover.

6. A method of protecting an electronic device from impacts, the method comprising:
providing an outer shell having:
a back portion, and
a plurality of curved arms connected to the back portion, the curved arms to engage a cushion cover on at least two surfaces and having pointed hooks that engage said cushion cover at edge portions of said electronic device, said outer shell formed of a plastic material that resiliently bends sufficiently during installation to engage said cushion cover without breaking, wherein each of said plurality of curved flexible arms is configured to generate a force on a respective one of said at least two surfaces of said cushion cover;

providing said cushion cover comprising:
elastomeric material that is form-fitted to cover a portion of said electronic device, said cushion cover having a density and elasticity that causes said cushion cover to conform to said electronic device, reduced thickness portions disposed in predetermined areas of said cushion cover, said plurality of curved flexible arms disposed in, and engaged with, said reduced thickness portions such that said force generated by said plurality of curved flexible arms is coupled through said reduced thickness portions to said electronic device, and raised impact portions located adjacent to said reduced thickness portions, said raised impact portions having a predetermined thickness; and a die cut plug formed in said cushion cover, wherein said die cut plug can be opened to provide access to a headphone jack on said electronic device;

forming a nipple in the die cut plug in said cushion cover, said nipple engaging said headphone lack;

forming, in the cushion cover, coring comprising ribs disposed between recesses in said raised impact portions, said ribs and recesses allowing said cushion cover to compress and absorb said impacts; and attaching said pointed hooks to said cushion cover along two edge portions located at longitudinal ends of said electronic device so that said outer shell extends along a back portion of said cushion cover in a longitudinal direction along said electronic device and said lateral edges of said cushion cover are not covered by said outer shell, said lateral edges of said cushion cover forming a gripping surface on said protective case, said back portion of said protective case configured to slide easily into and out of confined areas, wherein said outer shell is configured to disperse an impact to said cushion cover across a contact surface of said cushion cover.

7. The method of claim 6 further comprising:
placing a fluorescing material in said outer shell so that said outer shell can be located in low light conditions.

8. The method of claim 6 further comprising: forming the die cut plug in said cushion cover by cutting said cushion cover with a blade such that said die cut plug fits tightly in said cushion cover.

9. The method of claim 6 further comprising:
cutting said cushion cover with a blade to form strain relief openings in said cushion cover.

* * * * *